(12) United States Patent (10) Patent No.: US 8,091,010 B2
Yim (45) Date of Patent: Jan. 3, 2012

(54) ERROR CORRECTION CIRCUIT AND METHOD FOR REDUCING MISCORRECTION PROBABILITY AND SEMICONDUCTOR MEMORY DEVICE INCLUDING THE CIRCUIT

(75) Inventor: Yong-Tae Yim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1077 days.

(21) Appl. No.: 11/834,844

(22) Filed: Aug. 7, 2007

(65) Prior Publication Data

US 2008/0163033 A1 Jul. 3, 2008

(30) Foreign Application Priority Data

Dec. 29, 2006 (KR) .................. 10-2006-0137919

(51) Int. Cl.
    *G06F 11/10* (2006.01)
(52) U.S. Cl. ...................... 714/773; 714/774
(58) Field of Classification Search .................. 714/773, 714/774
    See application file for complete search history.

(56) References Cited

U.S. PATENT DOCUMENTS

| 5,734,663 | A | 3/1998 | Eggenberger | |
|---|---|---|---|---|
| 6,216,247 | B1 * | 4/2001 | Creta et al. ................ | 714/763 |
| 6,651,212 | B1 * | 11/2003 | Katayama et al. .......... | 714/763 |
| 7,103,829 | B2 * | 9/2006 | Van Dijk et al. ............ | 714/777 |
| 7,904,790 | B2 * | 3/2011 | Lee et al. .................... | 714/763 |
| 2005/0204264 | A1 | 9/2005 | Yusa | |

FOREIGN PATENT DOCUMENTS

| JP | 05225718 | 9/1993 |
|---|---|---|
| JP | 2000261326 | 9/2000 |
| JP | 2005242797 | 9/2005 |

* cited by examiner

*Primary Examiner* — Stephen Baker
(74) *Attorney, Agent, or Firm* — Volentine & Whitt, PLLC (57) ABSTRACT

An error correction circuit and method for reducing a miscorrection probability and a semiconductor memory device including the circuit are provided. The error correction circuit includes an error check and correction (ECC) encoder and an ECC decoder. The ECC encoder generates syndrome data enabling h-bit error correction based on information data and a generator polynomial, where "h" is 2 or an integer greater than 2. The ECC decoder may operate in a single mode for detecting an error position with respect to a maximum of (h–j) bits in the information data based on encoded data including the information and the syndrome data, where "j" is 1 or an integer greater than 1. Alternatively, the ECC decoder may operate in a first operation mode for detecting an error position with respect to a maximum of "h" bits in the information data or in a second operation mode for detecting an error position with respect to a maximum of (h–j) bits in the information data based on encoded data including the information and the syndrome data. Accordingly, the miscorrection probability is reduced, and therefore, data reliability is increased.

18 Claims, 9 Drawing Sheets

ERROR CORRECTION CIRCUIT AND METHOD FOR REDUCING MISCORRECTION PROBABILITY AND SEMICONDUCTOR MEMORY DEVICE INCLUDING THE CIRCUIT

CROSS-REFERENCE TO RELATED APPLICATION

This application claims the benefit of Korean Patent Application No. 10-2006-0137919, filed on Dec. 29, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to an error correction circuit, an error correction method, and a semiconductor memory device including the error correction circuit.

2. Description of Related Art

With the increase of memory capacity in semiconductor memory devices, an error correction circuit which can recover errors in defective memory cells is needed. Conventional error correction circuits may be divided into error correction circuits using a redundancy memory cell and error correction circuit using error check and correction (ECC).

A semiconductor memory device including an error correction circuit using a redundancy memory cell has normal memory cells and redundancy memory cells. Here, the semiconductor memory device replaces a memory cell having an error with a redundancy memory cell when writing or reading data. Usually, dynamic random access memory (DRAM) devices use such error correction circuit using the redundancy memory cell.

Meanwhile, a semiconductor memory device including an error correction circuit using ECC generates and stores redundancy data (referred to as parity data or syndrome data) as well as a data bit and thereafter determines occurrence or non-occurrence of an error using parity bits to correct the error. The error correction circuit using the ECC is usually used for read-only memory (ROM) devices and especially for flash memory devices including electrically erasable and programmable read-only memory (EEPROM) cells.

However, when errors occur beyond an error correctable range, the error correction circuit using the ECC may miscorrect errors, that is, has a miscorrection probability. For instance, in a case where a 5-bit error detection code (EDC) and 4-bit ECC are used with respect to 528-byte information data, a miscorrection probability is about $P6\times0.0015$ where $P6$ is a probability of occurrence of 6 or more bit errors. Mostly, with such error correction performance, there is not problem in system operation. However, in a particular situation such as when a large number of errors occur due to sudden degradation of a semiconductor memory device or when multiple burst errors occur due to power failure, even a moderate miscorrection probability will degrade system stability. Accordingly, an approach for reducing the miscorrection probability is required.

Figure 1:
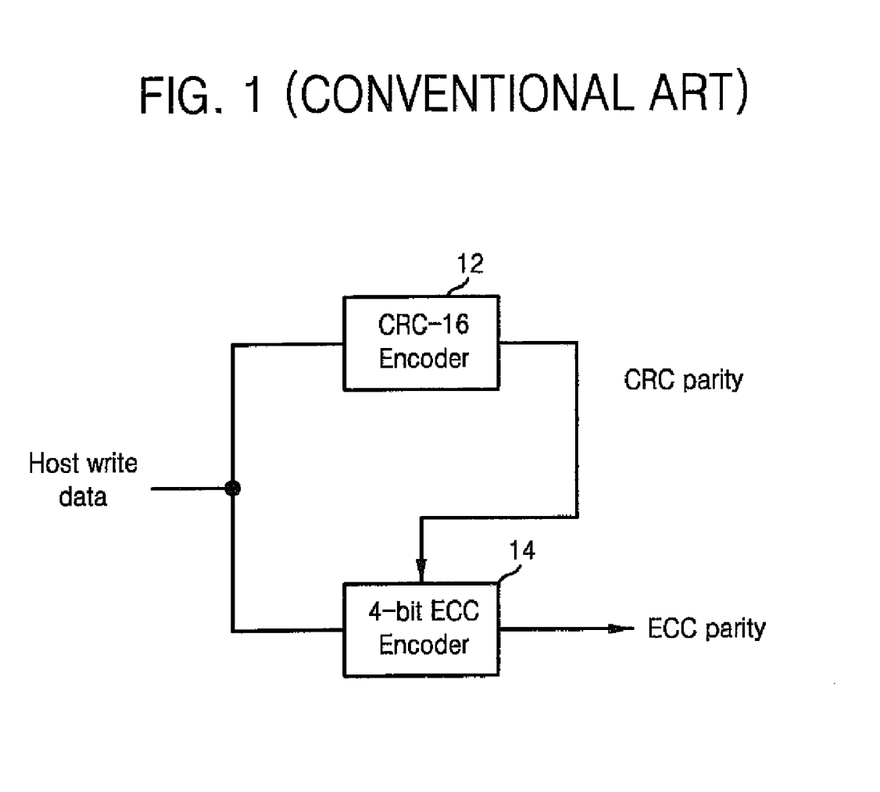
FIG. 1 is a functional block diagram of a conventional encoder.

Conventionally, in order to reduce the miscorrection probability, cyclic redundancy check (CRC) data is added and miscorrection in ECC is detected using the CRC data. FIG. 1 is a functional block diagram of a conventional encoder. Referring to FIG. 1, a conventional semiconductor memory device includes a CRC encoder 12 and an ECC encoder 14 to encode information data.

The CRC encoder 12 receives host write data (or information data) from a host. The CRC encoder 12 generates CRC data (or CRC parity data) and adds the CRC data (or CRC parity data) to the information data. The CRC parity may be 16-bit data as illustrated in FIG. 2.

The ECC encoder 14 generates ECC parity or syndrome data for ECC with respect to the information data with the CRC data, i.e., "host write data+CRC parity". When the ECC encoder 14 is a 4-bit ECC encoder, the ECC parity may be 52-bit data. If an even parity bit or an odd parity bit is added, the ECC parity may be a 53-bit data as illustrated in FIG. 2.

Figure 2:
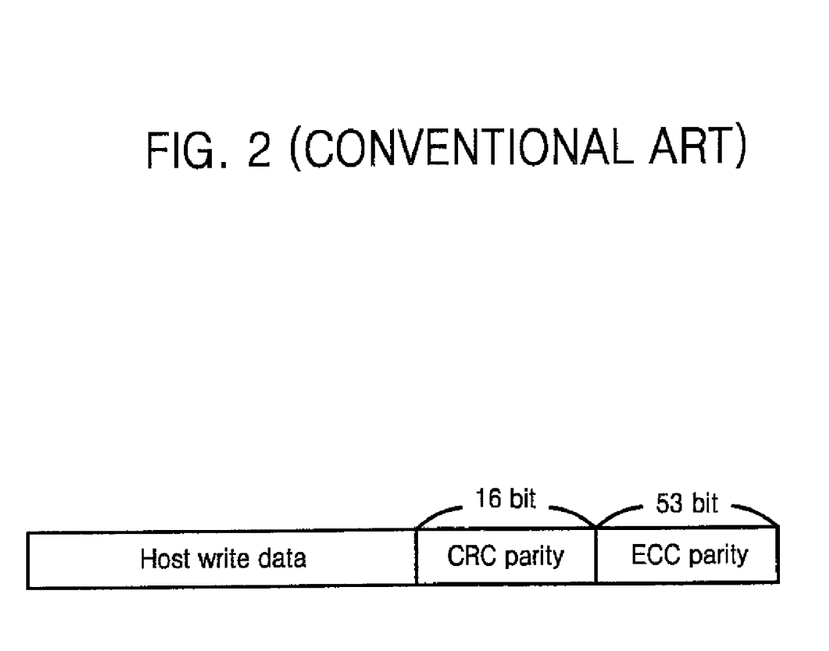
FIG. 2 illustrates the structure of a conventionally encoded data.

FIG. 2 illustrates an example of the structure of a conventionally encoded data. Referring to FIG. 2, after being processed by the CRC encoder 12, the encoded data is "host write data+CRC parity". After being processed by the ECC encoder 14, the encoded data is "host write data+CRC parity+ECC parity", which is stored in the memory.

Figure 3:
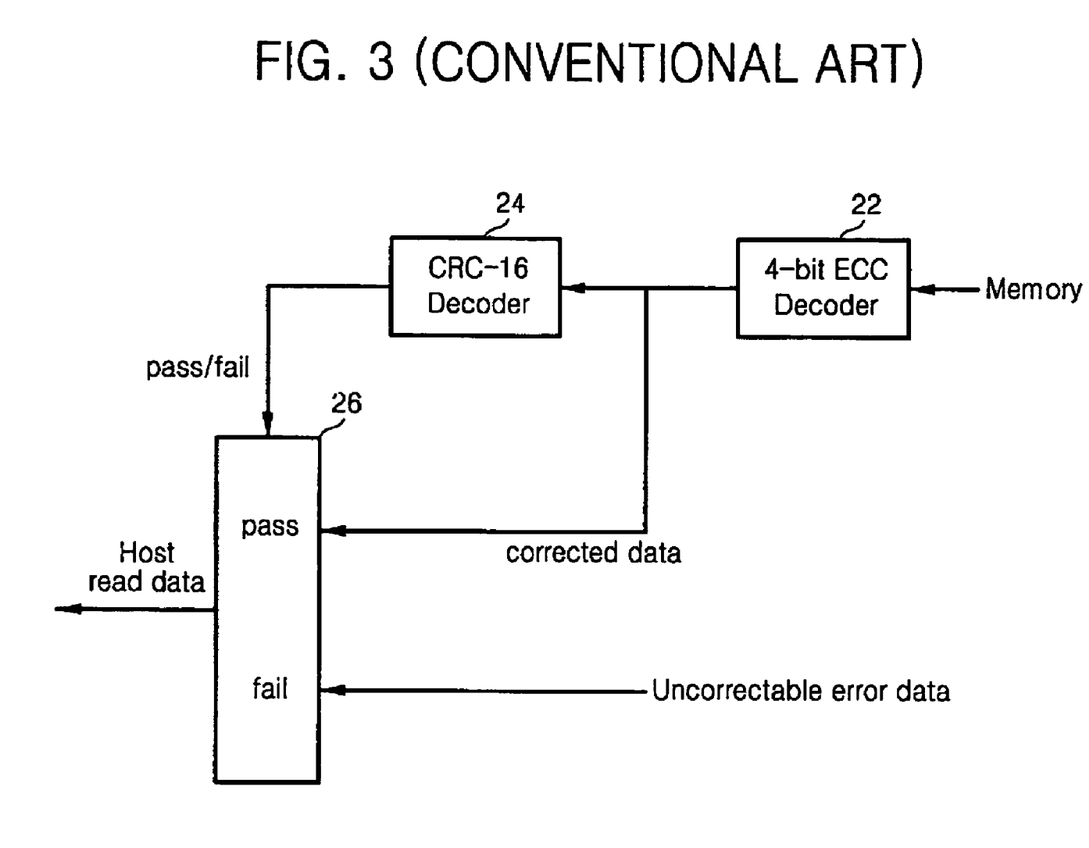
FIG. 3 is a functional block diagram of a conventional decoder.

FIG. 3 is a functional block diagram of a conventional decoder. Referring to FIG. 3, a conventional semiconductor memory device includes an ECC decoder 22, a CRC decoder 24, and a selector 26. The conventional semiconductor memory device performs decoding in a reverse order to the encoding order, that is, performs CRC decoding after performing ECC decoding on data read from the memory.

The ECC decoder 22 detects an error position by performing ECC decoding with respect to the data read from the memory and corrects an error bit according to the detected error position. The CRC decoder 24 receives corrected data from the ECC decoder 22, generates CRC data in the same manner as that performed by the CRC encoder 12, compares the generated CRC data with CRC data read from the memory, and determines occurrence or non-occurrence of an error. The CRC decoder 24 outputs a pass/fail signal according to a result of the determination. The selector 26 selects either the corrected data output from the ECC decoder 22 or predetermined uncorrectable error data in response to the pass/fail signal and outputs the selected data to the host as host read data.

In the above-described conventional method combining CRC and ECC, the miscorrection probability of 5-bit EDC/4-bit ECC is reduced to $P6\times0.0015\times2^{-16}$ where $P6$ is a probability of occurrence of 6 or more bit errors. This is an improvement compared to methods that do not use a CRC circuit. When the CRC circuit is added, however, it is necessary to add CRC codec (i.e., a CRC encoder plus a CRC decoder) and a control logic for controlling the CRC codec. In addition, since CRC should be performed during encoding and decoding, additional time (i.e., an additional clock cycle) is needed.

Therefore, an approach for effectively reducing the miscorrection probability of ECC methods—while minimizing additional hardware—is needed. Furthermore, circuits and methods that reduce miscorrection probability with a minimal increase of error correction time are desired.

SUMMARY OF THE INVENTION

Some embodiments of the present invention provide an error correction circuit that uses fewer ECC bits for decoding than for encoding to reduce miscorrection probability. Embodiments of the invention also provide a circuit that is configured to selectively operate in one of two alternative modes based on a probability of multi-bit errors. Embodiments of the invention advantageously eliminate the need for a CRC encoder, a CRC decoder, and related logic circuits. Accordingly, embodiments of the invention reduce hardware and improve error correction times compared to conventional approaches that utilize CRC codec.

According to an embodiment of the present invention, there is provided a memory device including: an error check and correction (ECC) encoder configured to generate syndrome data enabling h-bit error correction based on information data and a generator polynomial, where "h" is 2 or an integer greater than 2, the encoder further configured to output encoded data, the encoded data including the information data and the syndrome data; and an ECC decoder coupled to receive the encoded data, the ECC decoder configured, in a first operation mode, to detect an error position with respect to a maximum of (h−j) bits in the information data based on the encoded data, where "j" is 1 or an integer greater than 1.

According to another embodiment of the present invention, there is provided an error correction method including: generating syndrome data enabling h-bit error correction based on information data and a generator polynomial where "h" is 2 or an integer greater than 2; storing encoded data in memory, the encoded data including the information data and the syndrome data; reading the encoded data from the memory; detecting an error position with respect to a maximum of (h−j) bits in the information data based on the encoded data, where "j" is 1 or an integer greater than 1; and correcting the encoded data based on the detected error position.

According to another embodiment of the present invention, there is provided an error correction method including: generating syndrome data enabling h-bit error correction based on information data and a generator polynomial where "h" is 2 or an integer greater than 2; storing encoded data in memory, the encoded data including the information data and the syndrome data; reading the encoded data from the memory; determining whether the to proceed in a first operation mode or a second operation mode; if in the first operation mode, detecting a first error position with respect to a maximum of (h−j) bits in the information data using the encoded data, where "j" is 1 or an integer greater than 1; if in the second operation mode, detecting a second error position with respect to a maximum of "h" bits in the information data using the encoded data; and correcting the encoded data based on the first or second error position.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 4:
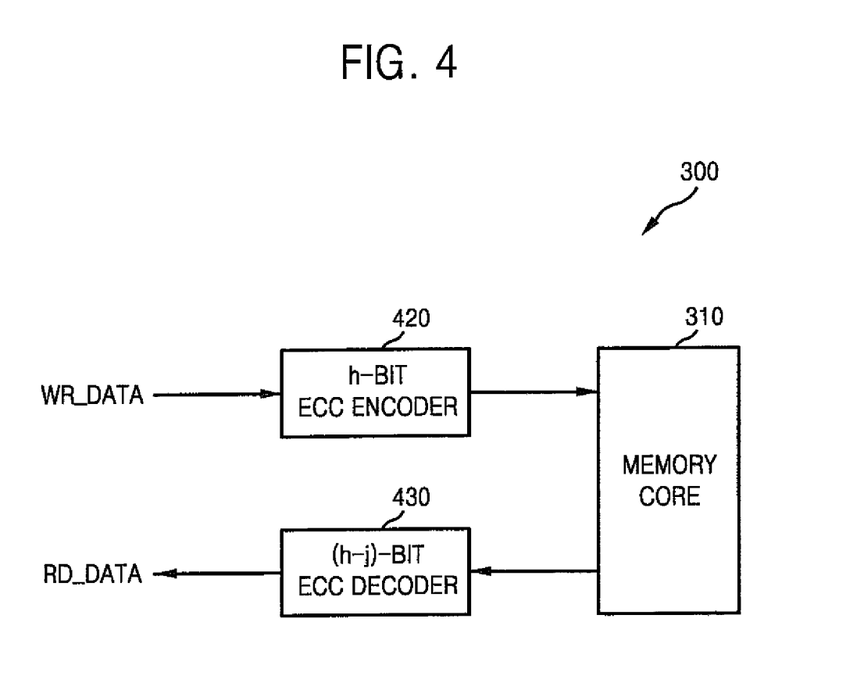
FIG. 4 is a functional block diagram of a semiconductor memory device according to some embodiments of the present invention.

FIG. 4 is a functional block diagram of a semiconductor memory device according to some embodiments of the present invention. The semiconductor memory device 300 includes a memory core 310 coupled to an error check and correction (ECC) circuit including an ECC encoder 420 and an ECC decoder 430.

The ECC encoder 420 generates syndrome data enabling h-bit error correction (where "h" is 2 or an integer greater than 2) based on information data WR_DATA received from a host (not shown) and a generator polynomial. In other words, the ECC encoder 420 encodes the information data WR_DATA using an h-bit ECC generator polynomial, which will be described later. Encoded data including the information data WR_DATA and the syndrome data is stored in the memory core 310.

Figure 6:
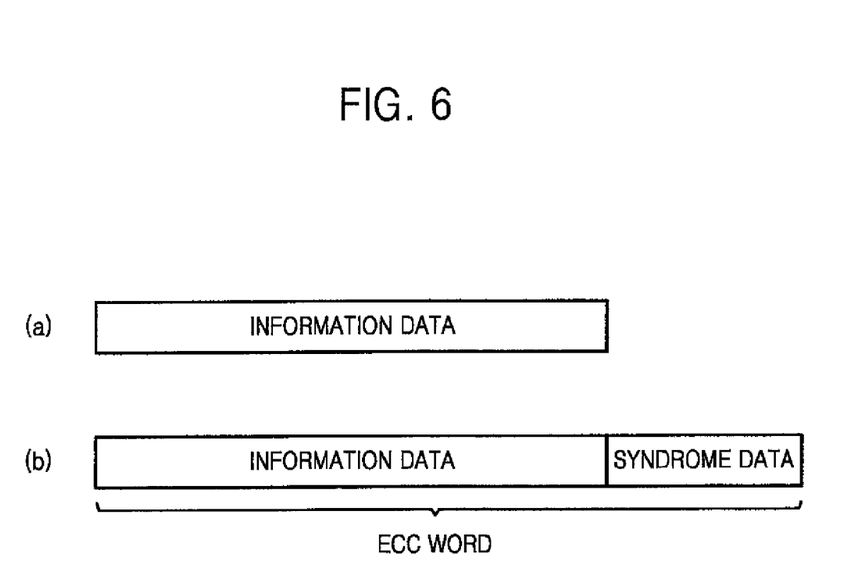
FIG. 6 illustrates data before and after encoding, according to some embodiments of the present invention.

FIG. 6 illustrates data before and after encoding, according to some embodiments of the present invention. Referring to FIG. 6, the data before the encoding (a) is information data, and the encoded data (b) is the information data with syndrome data. The encoded data (b) is also referred to herein as an ECC word.

With further regard to FIG. 4, the memory core 310 is a block of memory, for example a memory cell array, for storing data. The memory cell array may include electrically erasable and programmable read-only memory (EEPROM) cells having floating gate, but the present invention is not restricted thereto.

The ECC decoder 430 calculates an error position using encoded data read from the memory core 310. The error position indicates a location of a bit having an error. The ECC decoder 430 may also correct bits having an error according to the calculated error position. In the illustrated embodiment, the ECC decoder 430 is a (h−j)-bit ECC decoder which can correct up to (h−j) bits of error. The ECC decoder 430 may be a decoder which can detect (h−j+1) bit of error. In other words, the ECC decoder 430 may be a (h−j)-bit ECC/(h−j+1)-bit error detection code (EDC) decoder. Here, "j" is 1 or an integer greater than 1. Error corrected data RD_DATA is output from the ECC decoder 430 to the host.

As described above, the error correction circuit according to some embodiments of the present invention performs encoding using an h-bit (e.g., 5-bit) ECC generator polynomial (thereby increasing a hamming distance between codes) but performs error correction by decoding less than h bits (e.g., 4 bits)(thereby decreasing an error correction radius). As a result, a miscorrection probability is reduced to about $P6 \times 0.0015 \times 2^{-13}$, where P6 is a probability of occurrence of 6 or more bit errors, when 5-bit ECC encoding and 4-bit ECC decoding are used.

Figure 5:
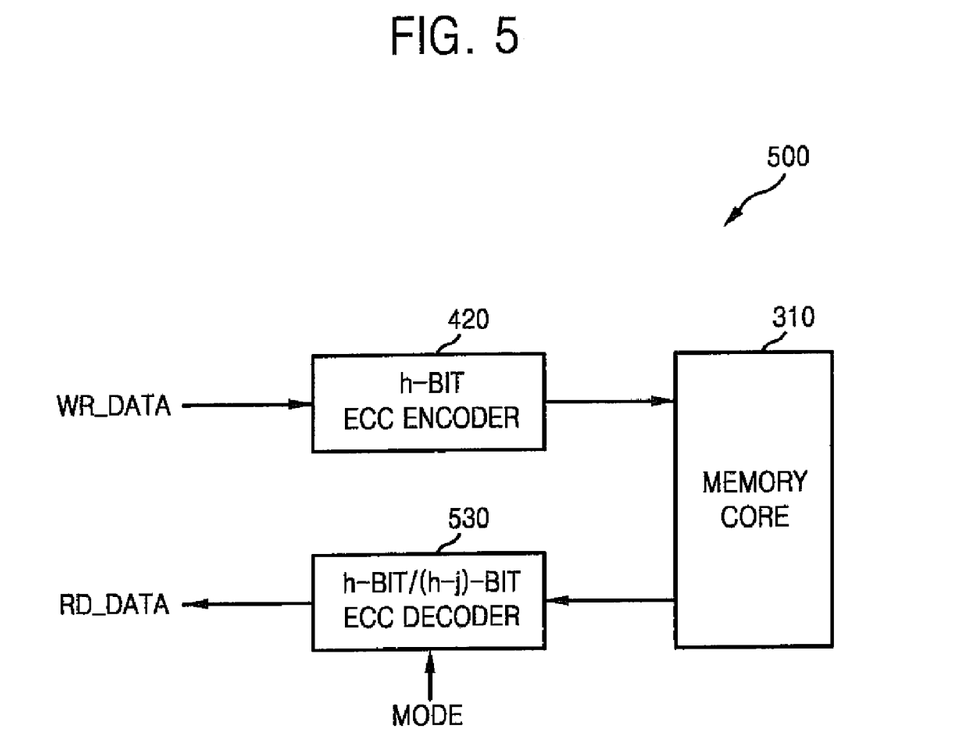
FIG. 5 is a functional block diagram of a semiconductor memory device according to other embodiments of the present invention.

FIG. 5 is a functional block diagram of a semiconductor memory device 500 according to other embodiments of the present invention. The semiconductor memory device 500 includes the memory core 310 coupled to an ECC circuit. The ECC circuit includes ECC encoder 420 and ECC decoder 530. The memory core 310 and the ECC encoder 420 have been described with reference to FIG. 4, and thus, a detailed description thereof will be omitted here.

The ECC decoder 530 operates in a first operation mode or a second operation mode in response to an operation mode signal MODE received from a host. In the first operation mode, the ECC decoder 530 calculates an error position with respect to a maximum of "h" bits using encoded data read from the memory core 310 and corrects bits having an error according to the calculated error position. In the second operation mode, the ECC decoder 530 calculates an error position with respect to a maximum of "h−j" bits using encoded data read from the memory core 310 and corrects bits having an error according to the calculated error position. Here, "j" is 1 or an integer greater than 1. In other words, the ECC decoder 530 operates as an h-bit ECC decoder or an (h−j)-bit ECC decoder based on the operation mode signal MODE. When the ECC decoder 530 operates as the (h−j)-bit ECC decoder, the function of the ECC decoder 530 is the same as an embodiment of the ECC decoder 430 illustrated in FIG. 4. When the ECC decoder 530 operates as the h-bit ECC decoder, the ECC decoder 530 can detect (h+1) bits of error, i.e., an h-bit ECC/(h+1)-bit EDC decoder. The following table summarizes the selectable configurations of the ECC decoder 530 with respect to h-bit ECC encoder 420.

| Operation Mode | ECC bits | EDC bits |
|---|---|---|
| first | h | h + 1 |
| second | h − j | h − j + 1 |

Error corrected data RD_DATA is output from the ECC decoder 530 to the host. As described below, the first operation mode may be most appropriate for a normal state of operation (where there is a relatively low probability of multi-bit errors), and the second operation mode may be most appropriate for an abnormal state of operation (where there is a relatively high probability of multi-bit errors).

Figure 7:
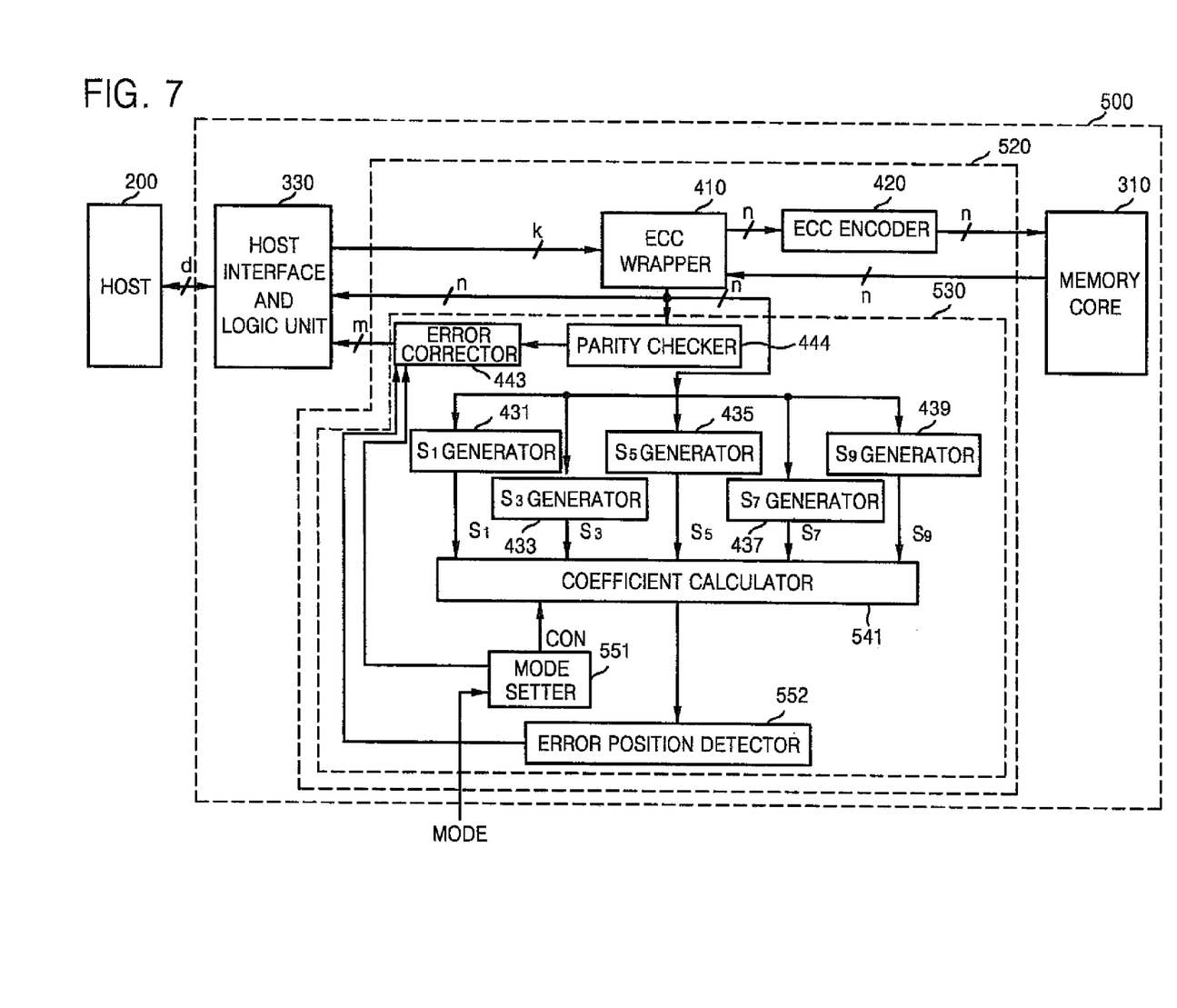
FIG. 7 is a detailed block diagram of the semiconductor memory device illustrated in FIG. 5.

FIG. 7 is a detailed block diagram of the semiconductor memory device 500 illustrated in FIG. 5. The semiconductor memory device 500 includes the memory core 310, an ECC circuit 520, and a host interface and logic unit 330 coupled in series.

The host interface and logic unit 330 may perform control and buffering for interface between a host 200 (e.g., a controller of a mobile device or a computer device) and the memory core 310. The host interface and logic unit 330 may include memory such as static random access memory (SRAM) (not shown). When the host 200 writes data to the semiconductor memory device 500, the data is encoded by the ECC circuit 520 and then recorded in the memory core 310 (e.g., a flash memory core). When data is read from the memory core 310, the data is subjected to error detection and correction by the ECC circuit 520 and then stored in the SRAM of the host interface and logic unit 330. The host 200 can then read the error corrected data stored in the SRAM. The host interface and logic unit 330 may transmit and receive d-bit parallel data to and from the host 200 where "d" is 2 or an integer greater than 2.

The ECC circuit 520 includes an ECC wrapper 410 coupled to an ECC encoder 420 and an ECC decoder 530. The ECC wrapper 410 receives "k" bits of information data (where "k" is 2 or an integer greater than 2, e.g., 4096) from the host interface and logic unit 330. The ECC wrapper 410 adds (n−k) bits of dummy data (where "n−k" is 1 or an integer greater than 1, e.g., 66), each of which has a predetermined logic value, e.g., "0", to the information data. The ECC wrapper then outputs "n" bits (e.g., 4096+66=4162 bits) of data in parallel or series to the ECC encoder 420.

Figure 9:
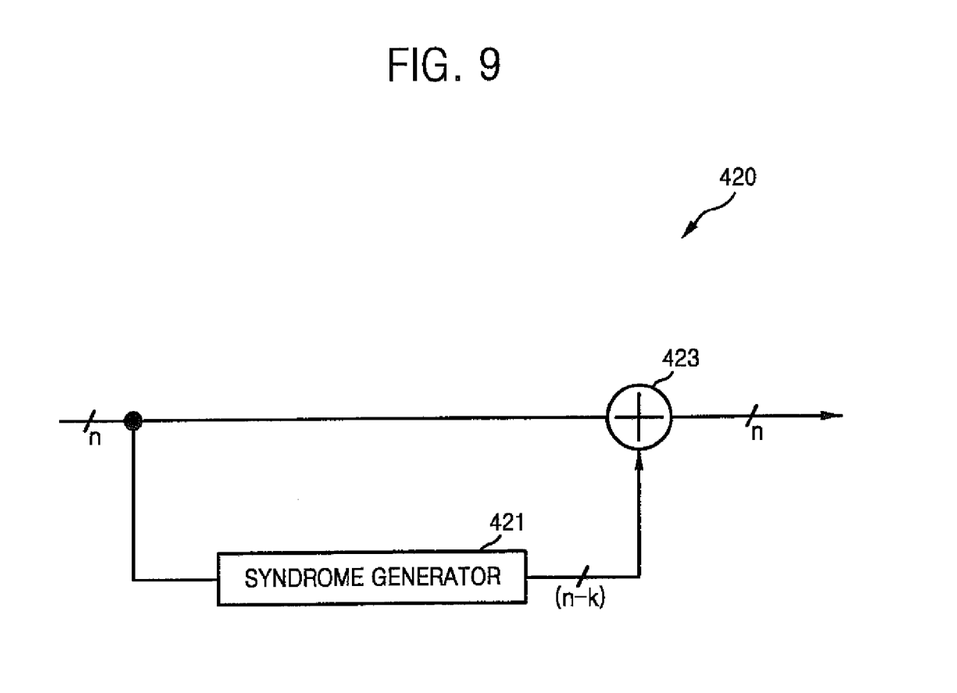
FIG. 9 is a functional block diagram of an error check and correction (ECC) encoder according to some embodiments of the present invention.

FIG. 9 is a functional block diagram of the ECC encoder 420 according to some embodiments of the present invention. The ECC encoder 420 includes a syndrome generator 421 and an exclusive OR (XOR) operator 423. The input of the syndrome generator 421 is coupled to a first input of the XOR operator 423, and the output of the syndrome generator 421 is coupled to a second input of the XOR operator 423.

The syndrome generator 421 receives n-bit data (i.e., "k" bits+(n−k) bits of dummy data) from the ECC wrapper 410 and divides the received n-bit data by predetermined data, thereby generating (n−k)-bit residual data (i.e., syndrome data of (n−k) bits). The predetermined data is a generator polynomial G(x) and (n−k) is determined by a maximum number of correctable error bits and/or a maximum number of detectable error bits.

The XOR operator 423 performs an XOR operation on the n-bit data received from the ECC wrapper 410 and the syndrome data. In other words, the XOR operator 423 replaces (n−k)-bit dummy data with the residual data.

Consequently, the ECC encoder 420 adds the (n−k)-bit residual data (or syndrome data) to the k-bit information data, thereby generating n-bit encoded data. When the information data, the syndrome data, and the encoded data are represented with I(x), S(x), and C(x), respectively, the relation therebetween is expressed by Equation (1).

$$S(x) = x^{(n-k)} I(x) \ \% \ G(x),$$

$$C(x) = x^{(n-k)} I(x) + S(x) = Q(x)G(x), \quad (1)$$

where $x^{(n-k)} I(x)$ is obtained by shifting the k-bit information data I(x) by (n−k) bits in a direction of a most significant bit (MSB), % G(x) indicates a modulo G(x) operation, and Q(x) is the quotient when C(x) is divided by G(x).

In embodiments of the present invention, it is assumed that the ECC encoder 420 is a 5-bit ECC encoder and the ECC decoder 530 is a 5-bit ECC/4-bit ECC decoder. In other words, it is assumed that "h" is 5 and "j" is 1. In this case, (n−k) is 66, G(x) is a 66th order polynomial, and S(x) is 65th order polynomial.

The n-bit encoded data is input to the memory core 310. The memory cell array included in the memory core 310 may be divided into an area for storing the information data and an area for storing the syndrome data. Alternatively, the n-bit encoded data may be stored in the memory cell array without an information data area and a syndrome data area being separated.

When encoded data stored in the memory core 310 is output, n-bit encoded data including k-bit information data and (n−k)-bit parity data is read from the memory core 310 and input to the ECC wrapper 410. At this time, the ECC wrapper 410 may buffer the n-bit encoded data.

The ECC decoder 530 includes: first through fifth partial syndrome generators 431, 433, 435, 437, and 439 coupled to the ECC wrapper 410; a coefficient calculator 541 coupled to the first through fifth partial syndrome generators 431, 433, 435, 437, and 439; a mode setter 551 coupled to the coefficient calculator 541; an error position detector 552 coupled to the coefficient calculator 541; and an error corrector 443 coupled to the mode setter 551 and the error position detector 552.

The ECC decoder 530 may also include a parity checker 444 coupled to the ECC wrapper 410 and the error corrector 443. The parity checker 444 may be an even parity checker or an odd parity checker. When the ECC decoder 530 includes the parity checker 444, the ECC encoder 420 further includes a parity bit generator (not shown) which generates an even or odd parity bit (hereinafter, referred to as a first parity bit) with respect to the encoded data. The parity checker 444 generates an even or odd parity bit (hereinafter, referred to as a second parity bit) with respect to the encoded data read from the memory core 310 and compares it with the first parity bit, thereby determining whether the encoded data has an error.

The first through fifth partial syndrome generators 431, 433, 435, 437, and 439 divide the n-bit encoded data output from the memory core 310 by their own predetermined data, respectively, thereby generating partial syndromes $S_1$, $S_3$, $S_5$, $S_7$, and $S_9$. When the n-bit encoded data output from the memory core 310 is R(x) and the predetermined data, i.e., partial generator polynomials of the respective first through fifth partial syndrome generators 431, 433, 435, 437, and 439 are $m_1(x)$, $m_3(x)$, $m_5(x)$, $m_7(x)$, and $m_9(x)$, the relation between these data is expressed by Equation (2):

$$S_1(x) = R(x) \ \% \ m_1(x),$$

$$S_3(x) = f\{R(x) \ \% \ m_3(x)\}$$

$$S_5(x) = f\{R(x) \ \% \ m_5(x)\}$$

$$S_7(x) = f\{R(x) \ \% \ m_7(x)\}$$

$$S_9(x) = f\{R(x) \ \% \ m_9(x)\} \quad (2)$$

where $S_1(x)$, $S_3(x)$, $S_5(x)$, $S_7(x)$, and $S_9(x)$ are the partial syndromes $S_1$, $S_3$, $S_5$, $S_7$, and $S_9$ generated by the first through fifth partial syndrome generators 431, 433, 435, 437, and 439, respectively, and % indicates a modulo operation. As shown in Equation (2), $S_1(x)$ may be dirtectly calculated from R(x) % $m_1(x)$. And, $S_3(x)$, $S_5(x)$, $S_7(x)$ and $S_9(x)$ may be calculated using R(x) % $m_3(x)$, R(x) % $m_5(x)$, R(x) % $m_7(x)$ and R(x) % $m_9(x)$, respectively.

The relation between the generator polynomial G(x) and the partial generator polynomials $m_1(x)$, $m_3(x)$, $m_5(x)$, $m_7(x)$, and $m_9(x)$ of the first through fifth partial syndrome generators 431, 433, 435, 437, and 439 may be defined as Equation (3):

$$G(x) = m_1(x) * m_3(x) * m_5(x) * m_7(x) * m_9(x) \quad (3)$$

where "*" indicates Galois field multiplication.

When the first through fifth partial syndromes $S_1$, $S_3$, $S_5$, $S_7$, and $S_9$ are all 0, there is no error in the encoded data. When any one of the first through fifth partial syndromes $S_1$, $S_3$, $S_5$, $S_7$, and $S_9$ is not 0, an error occurs in at least one bit in the encoded data.

When an error occurs, the coefficient calculator 541 calculates a coefficient of an error position equation using all or some of the first through fifth partial syndromes $S_1$, $S_3$, $S_5$, $S_7$, and $S_9$ in response to a control signal CON of the mode setter 551. The mode setter 551 sets an operation mode in response to the operation mode signal MODE received from the host and generates the control signal CON. For instance, when the operation mode is set to a first operation mode, the coefficient calculator 541 calculates a coefficient of a first error position equation using the first through fifth partial syndromes $S_1$, $S_3$, $S_5$, $S_7$, and $S_9$. When the operation mode is set to a second operation mode, the coefficient calculator 541 calculates a coefficient of a second error position equation using the first through fourth partial syndromes $S_1$, $S_3$, $S_5$, and $S_7$.

The error position equation has a reciprocal of an error bit as a root. The relation between coefficients $\sigma_1$, $\sigma_2$, $\sigma_3$, $\sigma_4$, and $\sigma_5$ of the error position equation and the partial syndromes $S_1$, $S_3$, $S_5$, $S_7$, and $S_9$ may be obtained using various algorithms including Equations (4) and (5).

Equation (4) is an example of the error position equation for correcting 1-bit error:

$$\sigma_1 x + 1 = 0 \quad (4)$$

where $\sigma_1 = S_1$ and a reciprocal of a root satisfying a first order equation, i.e., Equation (4) indicates the position of the 1-bit error.

Equation (5) is an example of the error position equation for correcting 2-bit error:

$$\sigma_2 x^2 + \sigma_1 x + 1 = 0 \quad (5)$$

where $\sigma_1 = S_1$, $\sigma_2 = (S_1^3 + S_3)/S_1$, and a reciprocal of a root satisfying a second order equation, i.e., Equation (5) indicates the position of the 2-bit error.

In a similar manner to that above described, coefficients of the error position equation can be calculated for correction of 3- or more-bit error.

In the current embodiments of the present invention, the coefficient calculator 541 can calculate the coefficients $\sigma_1$, $\sigma_2$, $\sigma_3$, $\sigma_4$, and $\sigma_5$ of the first error position equation, which allows a maximum of 5 bits of error to be corrected, in the first operation mode. The coefficient calculator 541 is also configured to calculate the coefficients $\sigma_1$, $\sigma_2$, $\sigma_3$, and $\sigma_4$ of the second error position equation, which allows a maximum of 4 bits of error to be corrected, in the second operation mode.

The error position detector 552 detects the positions of error bits using the coefficients $\sigma_1$, $\sigma_2$, $\sigma_3$, and $\sigma_4$ or the coefficients $\sigma_1$, $\sigma_2$, $\sigma_3$, $\sigma_4$, and $\sigma_5$, which are calculated by the coefficient calculator 541. The positions of the error bits can be identified when the root of the error position equation is obtained. Therefore, an i-th (e.g., i=1, 2, 3, 4, or 5) order error position equation should be solved according to the number of error bits. Since it is difficult to obtain a general solution of a fourth or fifth error position equation, a Chien search algorithm may be used to determine the roots of the polynomial. The Chien search algorithm makes use of the fact that the roots will be powers of primitive element $\alpha$. A test root can therefore be expressed as $\alpha^{-j}$ over the range of j=0 to j=(n−1):$\alpha^{-0}$, $\alpha^{-1}$, $\alpha^{-2}$, $\alpha^{-3}$ ... $\alpha^{-(n-1)}$. When $\alpha^{-j}$ satisfies an error position equation, the $j^{th}$ bit is determined to have an error. This operation may be performed with respect to each code of n size in order to determine whether substituting j (altering j over the range of 0 to n−1) into error position equation repeatedly as n times satisfies the equation.

The error corrector 443 corrects an error bit based on a detection result of the error position detector 552. The error corrector 443 may correct error by inverting a logic value of a bit having an error in the encoded data (or the information data) based on error position information output from the error position detector 552. The error corrector 443 may also refer to an output signal of the parity checker 444 and an output signal of the mode setter 551 in order to more accurately determine existence/non-existence of error and an error position. Error corrected data output from the error corrector 443 is provided to the host 200 via the host interface and logic unit 330.

It can be seen through experiments that at least 90% of errors are 1-bit errors and the remaining errors are 2-bit or more errors in a normal operating environment of the semiconductor memory device 500. Accordingly, in a normal state, a probability that an error of multiple bits (e.g., 6 bits) occurs is very low, and therefore, miscorrection by a 5-bit error correction circuit rarely occurs. For this reason, the host 200 may generate the operation mode signal MODE for operating the semiconductor memory device 500 in the first operation mode in the normal state. In the first operation mode, the semiconductor memory device 500 can perform 5-bit error correction using less hardware than the conventional 5-bit EDC/4-bit ECC+cyclic redundancy check (CRC)−16 error correction circuit illustrated in FIGS. 1 through 3 and is thus more efficient.

However, when a probability that massive errors will occur substantially increases, for example due to the degradation of the semiconductor memory device 500 or power failure, a miscorrection probability also increases in the performance of 5-bit error correction. In such abnormal state, the host 200 may generate the operation mode signal MODE for operating the semiconductor memory device 500 in the second operation mode. In the second operation mode, 5-bit error correction is disabled and only 4-bit error correction is performed. Accordingly, in the second operation mode, the ECC circuit (420, 430 or 420, 530) performs encoding using an h-bit (e.g., 5-bit) ECC generator polynomial during encoding, and therefore, a distance between codes, i.e., a hamming distance increases. Meanwhile, error correction through decoding is performed up to a less number of bits (e.g., 4 bits) than "h" bits, and therefore, an error correction radius decreases. As a result, a miscorrection probability also decreases.

Accordingly, with less hardware, the present invention maintains error correction performance and a miscorrection probability of the conventional 5-bit EDC/4-bit ECC+CRC−16 error correction circuit, thereby performing ECC more efficiently. Moreover, while the conventional 5-bit EDC/4-bit ECC+CRC−16 error correction circuit illustrated in FIGS. 1 through 3 has a 69 bits (16 bits of CRC parity+53 bits of ECC parity) of redundancy data, an error correction circuit according to some embodiments of the present invention has 66 bits of redundancy data which is less than the conventional error correction circuit has under similar conditions.

Figure 8:
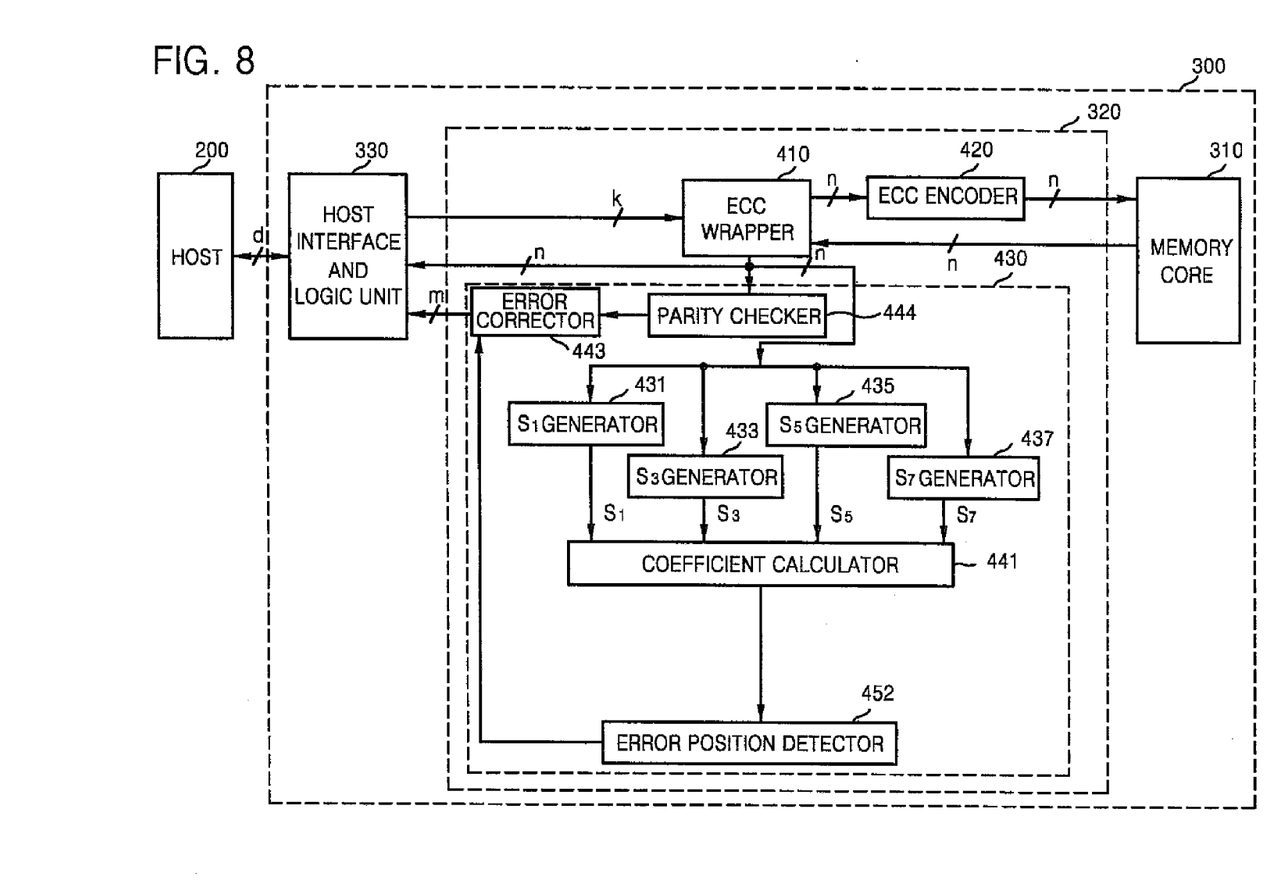
FIG. 8 is a detailed block diagram of the semiconductor memory device illustrated in FIG. 4.

FIG. 8 is a detailed block diagram of the semiconductor memory device 300 illustrated in FIG. 4. The semiconductor memory device 300 includes the ECC circuit 320 coupled to the memory core 310 and the host interface and logic unit 330. The ECC circuit 320 includes the ECC wrapper 410 coupled to the ECC encoder 420 and the ECC decoder 430. The memory core 310, the host interface and logic unit 330, the ECC wrapper 410, and the ECC encoder 420 are the same as those described with reference to FIG. 7. Thus, a detailed description thereof will be omitted here.

The ECC decoder 430 includes: first through fourth partial syndrome generators 431, 433, 435, and 437; a coefficient calculator 441 coupled to the first through fourth partial syndrome generators 431, 433, 435, and 437; an error position detector 452 coupled to the coefficient calculator 441; and the error corrector 443 coupled to the error position detector 452. As compared to the ECC decoder 530 illustrated in FIG. 7, the ECC decoder 430 operates as a 4-bit ECC decoder and does not need the fifth partial syndrome generator 439 and the mode setter 551. The ECC decoder 430 operates in a similar manner to the ECC decoder 530 operating in the second operation mode. Thus, a detailed description of the operation of the ECC decoder 430 will be omitted.

In the above described embodiments of the present invention, the error corrector 443 is included in the ECC decoder 430 or 530. However, the present invention is not restricted thereto. For instance, the host interface and logic unit 330 may correct an error by inverting a logic value of a bit having an error in encoded data based on error position information provided by the ECC decoder 430 or 530. Alternatively, the host interface and logic unit 330 may transmit the error position information provided by the ECC decoder 430 or 530 to the host 200 together with the n-bit encoded data (or only k-bit information data) read from the memory core 310. In this case, error correction may be performed in the host 200. In other words, the host 200 may correct the error by inverting the logic value of the bit having the error in the encoded data (or the information data) based on the error position information provided by the ECC decoder 430 or 530.

All the functions described herein may be performed in hardware, in software, or in a combination of hardware and software, according to design choice. Moreover, software functions may be expressed in processor-executable code, and the code may be stored in processor-readable medium such as random access memory (RAM), a hard drive, or a compact disc (CD).

As described above, according to some embodiments of the present invention, a miscorrection probability can be reduced with minimizing hardware addition and increase in error correction time. Accordingly, data reliability can be increased.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:
1. A memory device comprising:
an error check and correction (ECC) encoder configured to generate syndrome data enabling h-bit error correction based on information data and a generator polynomial, where "h" is 2 or an integer greater than 2, the encoder further configured to output encoded data, the encoded data including the information data and the syndrome data;

an ECC decoder configured to receive the encoded data from a memory core coupled to the ECC encoder and correct at most (h-j) errors in the information data based on the encoded data, where "j" is 1 or an integer greater than 1, wherein the memory core receives and stores the encoded data from the ECC encoder.

2. The memory device of claim 1, wherein the memory core comprises electrically erasable and programmable read-only memory (EEPROM) cells.

3. The memory device of claim 2, further comprising a host interface and logic unit coupled to the ECC decoder, the host interface and logic unit configured to transmit the encoded data read from the memory core and error position data to a host, wherein the host is configured to correct the encoded data based on the error position data.

4. The memory device of claim 1, wherein the ECC decoder comprises:

a partial syndrome generator configured to generate at least two partial syndromes using the encoded data;

a coefficient calculator configured to calculate coefficients of an error position equation using the at least two partial syndromes; and an error position detector configured to detect the error position based on the coefficients.

5. The error correction circuit of claim 4, wherein the ECC decoder further comprises an error corrector configured to correct the encoded data based on the detected error position.

6. The memory device of claim 4, wherein the ECC encoder comprises a parity bit generator configured to generate a first parity bit with respect to the encoded data, wherein the ECC decoder further comprises a parity checker configured to generate a second parity bit using the encoded data and to compare the second parity bit with the first parity bit, and wherein each of the first and second parity bits is one of an even parity bit and an odd parity bit.

7. A memory device comprising:

an error check and correction (ECC) encoder configured to generate syndrome data enabling h-bit error correction based on information data and a generator polynomial, where "h" is 2 or an integer greater than 2, the encoder further configured to output encoded data, the encoded data including the information data and the syndrome data; and an ECC decoder coupled to receive the encoded data, the ECC decoder configured, in a first operation mode, to detect an error position with respect to a maximum of (h-j) bits in the information data based on the encoded data, where "j" is 1 or an integer greater than 1, wherein the ECC decoder is further configured, in a second operation mode, to detect an error position with respect to a maximum of "h" bits in the information data based on the encoded data, wherein the ECC decoder operates in the first operation mode or the second operation mode in response to an operation mode signal.

8. The memory device of claim 7, wherein the operation mode signal is received from a host.

9. The memory device of claim 7, wherein the ECC decoder comprises:

a mode setter configured to set an operation mode in response to the operation mode signal and to generate a control signal;

a partial syndrome generator configured to generate at least two partial syndromes using the encoded data;

a coefficient calculator configured to calculate coefficients of a first error position equation or coefficients of a second error position equation using the at least two partial syndromes based on the control signal; and an error position detector configured to detect the error position based on the coefficients output from the coefficient calculator.

10. The memory device of claim 9, wherein the ECC decoder further comprises an error corrector configured to correct the encoded data based on the detected error position.

11. The memory device of claim 7, further comprising a memory core, the memory core being coupled to the ECC encoder and the ECC decoder, the memory core configured to store the encoded data.

12. The memory device of claim 11, wherein the memory core comprises electrically erasable and programmable read-only memory (EEPROM) cells.

13. An error correction method comprising:

generating syndrome data enabling h-bit error correction based on information data and a generator polynomial where "h" is 2 or an integer greater than 2;

generating a first parity bit based on at least one of the information data and an encoded data, the encoded data including the information data and the syndrome data;

storing the encoded data in a memory core;

reading the encoded data from the memory core;

after reading the encoded data, generating a second parity bit based on the at least one of the information data and the encoded data;

comparing the first parity bit and the second parity bit;

detecting an error position with respect to a maximum of (h-j) bits in the information data based on the encoded data, where "j" is 1 or an integer greater than 1; and correcting the encoded data based on the detected error position.

14. The error correction method of claim 13, wherein the detecting the error position comprises:

generating at least two partial syndromes using the encoded data;

calculating coefficients of an error position equation using the at least two partial syndromes; and detecting the error position based on the coefficients.

15. An error correction method comprising:

generating syndrome data enabling h-bit error correction based on information data and a generator polynomial where "h" is 2 or an integer greater than 2;

storing encoded data in memory, the encoded data including the information data and the syndrome data;

reading the encoded data from the memory;

determining whether to proceed in a first operation mode or a second operation mode;

if in the first operation mode, detecting a first error position with respect to a maximum of (h-j) bits in the information data using the encoded data, where "j" is 1 or an integer greater than 1;

if in the second operation mode, detecting a second error position with respect to a maximum of "h" bits in the information data using the encoded data; and correcting the encoded data based on the first or second error position.

16. The error correction method of claim 15, wherein the detecting the first error position comprises:

generating at least two partial syndromes using the encoded data;

calculating coefficients of a first error position equation using the at least two partial syndromes; and detecting the first error position based on the coefficients of the first error position equation.

17. The error correction method of claim 15, wherein determining whether to proceed in the first operation mode or the second operation mode is based on an operation mode signal received from a host.

18. The error correction method of claim 15, wherein the first operation mode is associated with an increase in multi-bit errors in the information data as compared to a normal state of operation.

* * * * *